(12) United States Patent
Iwawaki et al.

(10) Patent No.: US 12,532,736 B2
(45) Date of Patent: Jan. 20, 2026

(54) INTEGRATED CIRCUIT DEVICE

(71) Applicant: Seiko Epson Corporation, Tokyo (JP)

(72) Inventors: Takanori Iwawaki, Suwa (JP);
Motoaki Nishimura, Chino (JP);
Yoshihiko Nimura, Hara (JP); Katsumi Inoue, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 909 days.

(21) Appl. No.: 17/826,243

(22) Filed: May 27, 2022

(65) Prior Publication Data

US 2022/0384293 A1 Dec. 1, 2022

(30) Foreign Application Priority Data

May 31, 2021 (JP) ................. 2021-090754

(51) Int. Cl.
*H01L 23/34* (2006.01)
*H01L 21/67* (2006.01)
*H02H 3/08* (2006.01)

(52) U.S. Cl.
CPC ...... *H01L 23/345* (2013.01); *H01L 21/67248* (2013.01); *H02H 3/085* (2013.01)

(58) Field of Classification Search
CPC .. H01L 23/345; H01L 21/67248; H02H 3/085
See application file for complete search history.

(56) References Cited

U.S. PATENT DOCUMENTS

| | | |
|---|---|---|
| 4,642,668 A | 2/1987 | Tacken |
| 5,642,252 A | 6/1997 | Sakamoto et al. |
| 2010/0176480 A1* | 7/2010 | Senda ................. H01L 23/3107 257/692 |
| 2014/0043052 A1* | 2/2014 | Lindholm ............ H01L 23/345 324/762.03 |
| 2016/0099560 A1* | 4/2016 | Yamada ................. H02H 5/044 361/103 |
| 2018/0321094 A1 | 11/2018 | Jang et al. |
| 2019/0067267 A1 | 2/2019 | Shishikura |

FOREIGN PATENT DOCUMENTS

| | | |
|---|---|---|
| CN | 204947888 U | 1/2016 |
| JP | S59-117263 A | 7/1984 |
| JP | H07-050389 A | 2/1995 |
| JP | 2005-150762 A | 6/2005 |
| JP | 2011-036016 A | 2/2011 |
| JP | 2015-208183 A | 11/2015 |
| JP | 2016-077040 A | 5/2016 |
| JP | 2019-047104 A | 3/2019 |
| WO | 2021-059881 A1 | 4/2021 |

\* cited by examiner

*Primary Examiner* — Robert G Bachner
(74) *Attorney, Agent, or Firm* — Harness, Dickey & Pierce, P.L.C.

(57) ABSTRACT

An integrated circuit device includes a heating element, and a control circuit configured to control flow of a current through the heating element. An outer shape of the integrated circuit device has a first side and a second side intersecting the first side. An outer shape of the heating element has a short side and a long side. A distance between the long side of the heating element and the first side of the integrated circuit device is larger than a distance between the short side of the heating element and the second side of the integrated circuit device.

3 Claims, 13 Drawing Sheets

FIG. 10

INTEGRATED CIRCUIT DEVICE

The present application is based on, and claims priority from JP Application Serial Number 2021-090754, filed May 31, 2021, the disclosure of which is hereby incorporated by reference herein in its entirety.

BACKGROUND

1. Technical Field

The present disclosure relates to an integrated circuit device and the like.

2. Related Art

JP A-2016-077040 discloses a method for arranging, in a circuit device that drives a direct current motor, a bridge circuit for improving a detection time and detection accuracy of an overheated state.

In JP A-2016-077040, since a shape of a transistor serving as a heating element and an arrangement direction when the transistor is arranged in a specific region on a chip are not taken into consideration, there is a problem that heat bias inside the chip occurs.

SUMMARY

An aspect of the present disclosure relates to an integrated circuit device including: a heating element; and a control circuit configured to control flow of a current through the heating element, in which an outer shape of the heating element has a short side and a long side, an outer shape of the integrated circuit device has a first side and a second side intersecting the first side, and a distance between the long side of the heating element and the first side of the integrated circuit device is larger than a distance between the short side of the heating element and the second side of the integrated circuit device.

Another aspect of the present disclosure relates to an integrated circuit device including: a charging transistor configured to charge a load; a discharging transistor configured to discharge the load; and a control circuit configured to control a current flowing through the charging transistor and a current flowing through the discharging transistor, in which an outer shape of the charging transistor has a first short side and a first long side, an outer shape of the discharging transistor has a second short side and a second long side, an outer shape of the integrated circuit device has a first side, a second side intersecting the first side, and a third side which is an opposite side of the first side, a distance between the first long side of the charging transistor and the first side of the integrated circuit device is larger than a distance between the first short side of the charging transistor and the second side of the integrated circuit device, and a distance between the second long side of the discharging transistor and the third side of the integrated circuit device is larger than a distance between the second short side of the discharging transistor and the second side of the integrated circuit device.

BRIEF DESCRIPTION OF THE DRAWINGS

FIG. 10 shows a detailed fourth configuration example of the integrated circuit device.

DESCRIPTION OF EXEMPLARY EMBODIMENTS

Hereinafter, a preferred embodiment of the present disclosure will be described in detail. The present embodiment to be described below does not unduly limit contents described in claims, and all configurations described in the present embodiment are not necessarily essential constituent elements.

1. Integrated Circuit Device

Figure 1:
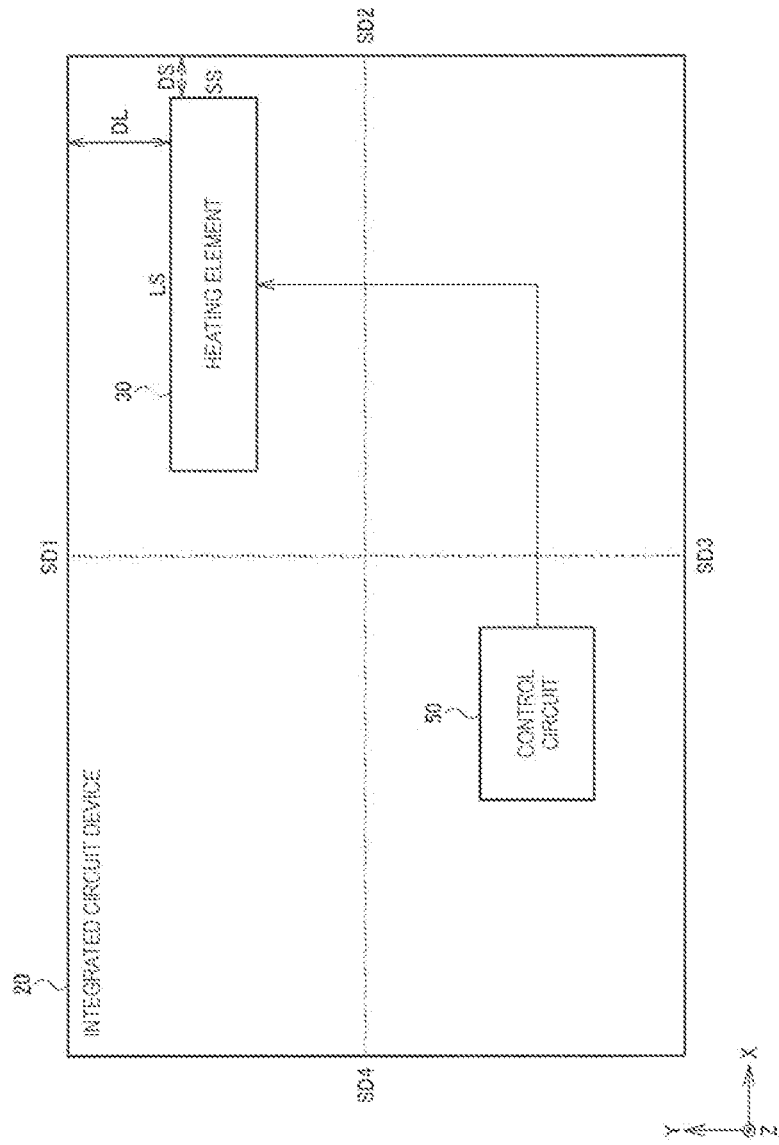
FIG. 1 shows a configuration example of an integrated circuit device according to the present embodiment.

FIG. 1 shows a basic configuration example of an integrated circuit device 20 according to the present embodiment. The integrated circuit device 20 includes a heating element 30 and a control circuit 50. FIG. 1 and FIGS. 8, 9, 10, and 14 described later show a layout arrangement of the integrated circuit device 20 in a plan view. The plan view is, for example, a plan view in a direction orthogonal to a substrate of the integrated circuit device 20. The integrated circuit device 20 according to the present embodiment can also be used in a heater circuit. In addition, the integrated circuit device 20 according to the present embodiment can be used as a heater circuit used in, for example, an oven-controlled crystal oscillator.

The integrated circuit device 20 is, for example, an integrated circuit (IC) manufactured by a semiconductor process, and is a semiconductor chip in which a circuit element is formed on a semiconductor substrate. An outer shape of the integrated circuit device 20 has a first side SD1 and a second side SD2 intersecting the first side SD1. In addition, the outer shape of the integrated circuit device 20 has a third side SD3 which is an opposite side of the first side SD1 and a fourth side SD4 which is an opposite side of the second side SD2. The outer shape of the integrated circuit device 20 is, for example, an outer shape of a rectangular semiconductor chip that is the integrated circuit device 20.

For example, the first side SD1, the second side SD2, the third side SD3, and the fourth side SD4 are sides of a substrate of the semiconductor chip. The semiconductor chip is also referred to as silicon die. In the present embodiment, a direction along the first side SD1 of the integrated circuit device 20 is set as an X direction, and a direction along the second side SD2 is set as a Y direction. In addition, a direction orthogonal to the X direction and the Y direction is set as a Z direction. The Z direction is a direction orthogonal to a semiconductor substrate of the integrated circuit device 20. The X direction, the Y direction, and the Z direction are an X axis direction, a Y axis direction, and a Z axis direction, respectively.

The heating element 30 is an element that generates heat. The heating element 30 can be implemented by, for example, a transistor such as a MOS transistor or a bipolar transistor, or a resistance element. When the heating element 30 is implemented by a MOS transistor, the MOS transistor may be an N-type transistor or a P-type transistor.

An outer shape of the heating element 30 has a short side SS and a long side LS. In FIG. 1, the long side LS of the heating element 30 is along the X direction, and the short side SS is along the Y direction. Specifically, the outer shape of the heating element 30 is a rectangle having the short side SS and the long side LS. The outer shape of the heating element 30 is, for example, an outer shape of an arrangement region of the heating element 30. As long as the outer shape of the heating element 30 at least has the short side SS and the long side LS, the outer shape of the heating element 30 may be a polygonal outer shape other than a rectangle.

The control circuit 50 is a circuit that controls flow of a current through the heating element 30. The control circuit 50 is implemented by, for example, a logic circuit. For example, when the heating element 30 is a MOS transistor, the control circuit 50 controls a current flowing through the MOS transistor which is the heating element 30 by controlling a gate of the MOS transistor. In addition, when the heating element 30 is a bipolar transistor, the control circuit 50 controls collector current flowing through the bipolar transistor, for example, by controlling a voltage between a base and an emitter of the bipolar transistor. Further, when the heating element 30 is a resistance element, the control circuit 50 controls a current flowing through the resistance element by controlling a voltage applied to the resistance element or controlling a current source coupled to the resistance element.

In the present embodiment, as shown in FIG. 1, a distance DL between the long side LS of the heating element 30 and the first side SD1 of the integrated circuit device 20 is larger than a distance DS between the short side SS of the heating element 30 and the second side SD2 of the integrated circuit device 20. That is, a relationship of DL>DS is established. Specifically, the distance DL is a distance between the long side LS of the heating element 30 and the first side SD1 of the integrated circuit device 20 facing the long side LS. For example, the distance DL is a distance between the first side SD1 and a long side LS, whose distance to the first side SD1 of the integrated circuit device 20 is shorter, in the two long sides of the heating element 30. In addition, the distance DS is a distance between the short side SS of the heating element 30 and the second side SD2 of the integrated circuit device 20 facing the short side SS. For example, the distance DS is a distance between the second side SD2 and a short side SS, whose distance to the second side SD2 of the integrated circuit device 20 is shorter, in the two short sides of the heating element 30.

As described above, the integrated circuit device 20 according to the present embodiment includes the heating element 30 and the control circuit 50, and the distance DL between the long side LS of the heating element 30 and the first side SD1 of the integrated circuit device 20 is larger than the distance DS between the short side SS of the heating element 30 and the second side SD2 of the integrated circuit device 20. A reason for setting DL>DS in this way will be described in detail below.

Figure 2:
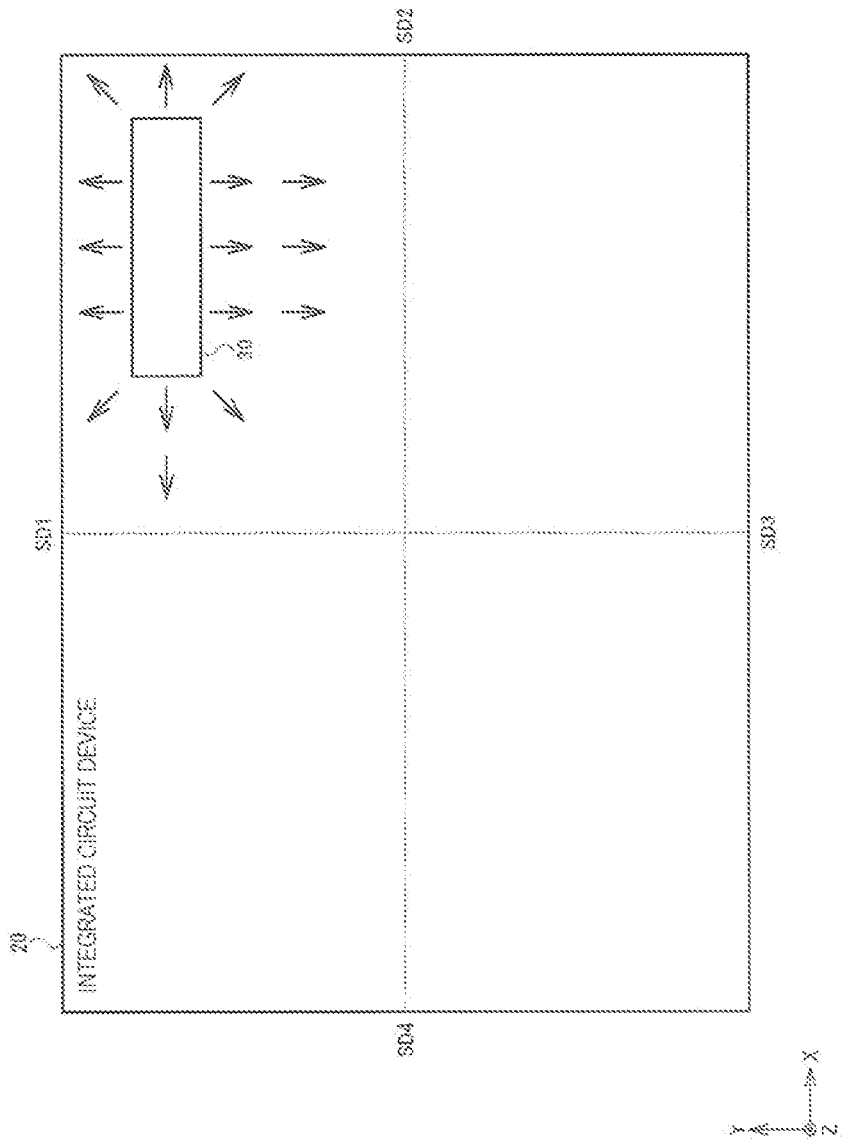
FIG. 2 is a schematic diagram showing heat diffusion in a plane of the integrated circuit device which does not adopt an arrangement according to the present embodiment.
Figure 3:
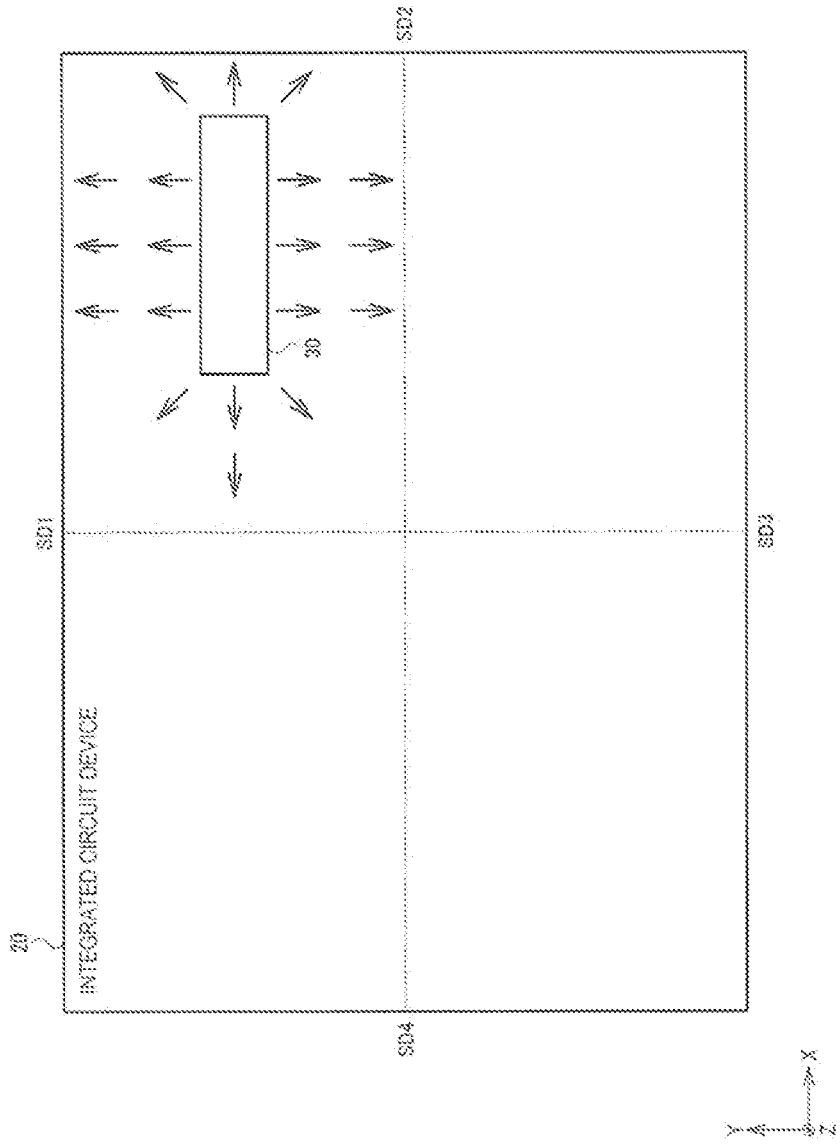
FIG. 3 is a schematic diagram showing heat diffusion in the plane of the integrated circuit device which adopts the arrangement according to the present embodiment.

For example, FIG. 2 is a schematic diagram showing heat diffusion in a plane of the integrated circuit device 20 which does not adopt an arrangement according to the present embodiment, while FIG. 3 is a schematic diagram showing heat diffusion in the plane of the integrated circuit device 20 which adopts the arrangement according to the present embodiment. Specifically, arrows in FIG. 2 indicate a state how heat is diffused when the heating element 30 is arranged such that DL=DS, while arrows in FIG. 3 indicates a state how heat is diffused when the heating element 30 is arranged such that DL>DS.

Main materials constituting the integrated circuit device 20 are, for example, a silicon substrate, a metal wiring such as an aluminum wiring, and an insulating film such as silicon oxide. In addition, an outside of the integrated circuit device 20 is covered with, for example, a mold resin.

Here, regarding thermal conductivity of each material, thermal conductivity of an aluminum wiring is about 220 W/m/K, thermal conductivity of a silicon substrate doped with impurities is from 120 W/m/K to 150 W/m/K, thermal conductivity of a silicon oxide is from 1.3 W/m/K to 1.4 W/m/K, thermal conductivity of a mold resin is about 0.2 W/m/K or less, and thermal conductivity of air is from 0.02 W/m/K to 0.03 W/m/K.

Therefore, in FIGS. 2 and 3, since heat diffused toward the third side SD3 and the fourth side SD4 of the integrated circuit device 20 among heat released from the heating element 30 is separated from the facing third side SD3 and fourth side SD4 by a sufficient distance through silicon or a metal wiring such as aluminum having higher thermal conductivity than a mold resin, the heat is diffused without being accumulated.

Meanwhile, heat released toward the first side SD1 or the second side SD2 easily reaches an end of the integrated circuit device 20, and is accumulated in a narrow region from the heating element 30 to the first side SD1 or the second side SD2 of the integrated circuit device 20 since there is a mold resin having very low thermal conductivity behind the end of the integrated circuit device 20, so that local heat bias occurs inside the integrated circuit device 20.

In this respect, as compared with the arrangement in FIG. 2 in which DL=DS, in the arrangement in FIG. 3 in which DL>DS, a distance between the long side LS and the first side SD1 of the integrated circuit device 20 facing the long side LS is longer, heat retention is less likely to occur, and local heat bias is less likely to occur inside the integrated circuit device 20. Therefore, according to the arrangement according to the present embodiment in which DL>DS, it is possible to prevent occurrence of a malfunction caused by uneven distribution of heat generated inside the integrated circuit device 20.

Figure 4:
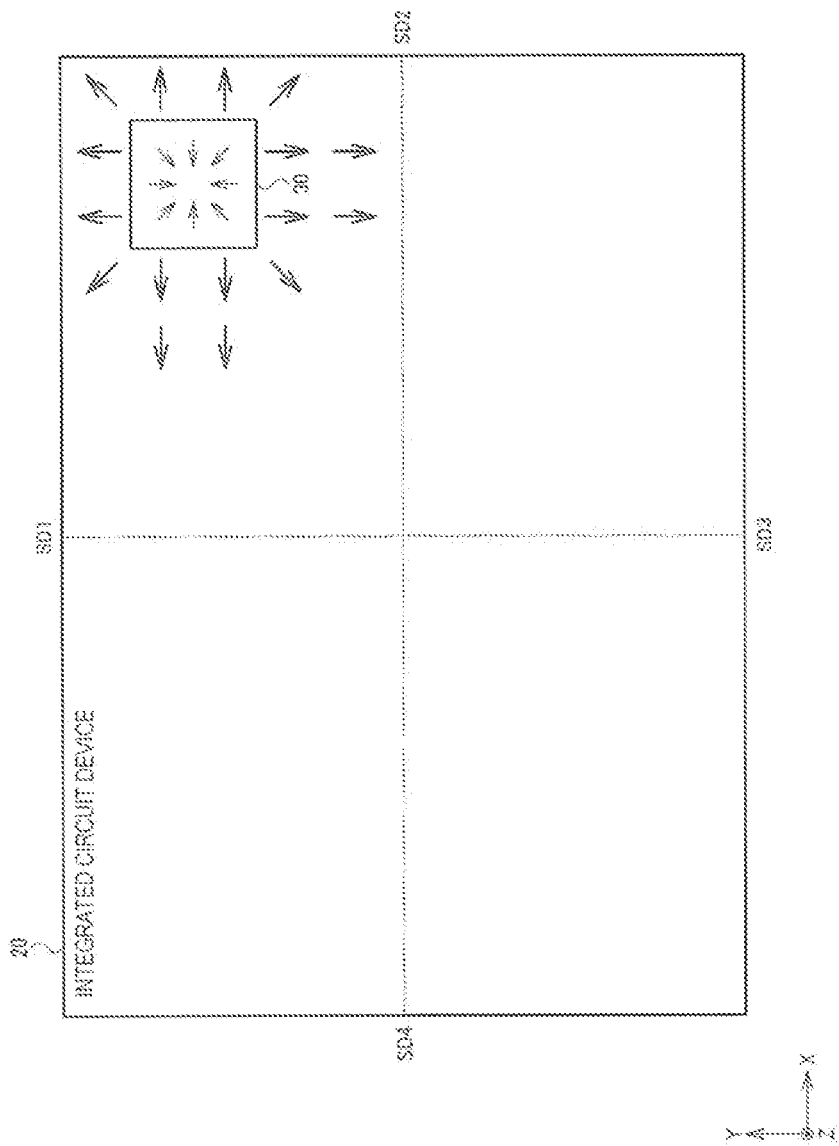
FIG. 4 is a schematic diagram showing heat diffusion in the plane of the integrated circuit device which does not adopt the arrangement according to the present embodiment.

FIG. 4 is a schematic diagram showing, with arrows, diffusion of heat when the outer shape of the heating element 30 is a square. Considering a relationship between the outer shape of the heating element 30 and the heat released from the heating element 30, regarding an area of the heating element 30 in a plan view, the longer an outer periphery of the outer shape of the heating element 30 in the plan view is, the larger an area in which the heating element 30 is in contact with the outside is. Specifically, when there are the heating elements 30 having the same area in the plan view, an outer periphery of the outer shape thereof increases and an area in which the heating element 30 is in contact with the outside also increases in an order of the outer shape of a circle, a square, and a rectangle. That is, considering the heating elements 30 having the same area in the plan view, heat dissipation of heat to the outside is improved in the order of a circle, a square, and a rectangle. Generally, an outer shape of a region of an element formed at a semiconductor chip in the plan view is a rectangle. Therefore, as compared with a case where the outer shape of the heating element 30 is a rectangle, when the outer shape of the heating element 30 is a square, the area in contact with the outside reduces, and heat is likely to be accumulated inside the heating element 30.

For example, in an example in FIG. 4 to which the arrangement according to the present embodiment is not applied, the outer shape of the heating element 30 in the plan view does not have a long side and a short side, and is specifically a square. In this case, as shown by the arrows inside the heating element 30 in FIG. 4, a part of the heat generated by the heating element 30 is accumulated inside the heating element 30.

Meanwhile, in an example in FIG. 3 to which the arrangement according to the present embodiment is applied, the outer shape of the heating element 30 has the long side LS and the short side SS as shown in FIG. 1, and is specifically a rectangle. Therefore, as compared with a case where the outer shape of the heating element 30 is a square as in FIG. 4, in FIG. 3, as a length of the outer periphery increases, the area in which the heating element 30 is in contact with the outside increases, heat is easily diffused to the outside through the long side LS, and whereby the heat accumulated inside the heating element 30 is reduced.

When a length of the long side LS is substantially at least twice a length of the short side SS, the heat dissipation of the heating element 30 is remarkably improved. Therefore, in the present embodiment, it is desirable that the length of the long side LS of the heating element 30 is at least twice the length of the short side SS.

From the above description, in order to improve the heat dissipation of the heating element 30 and alleviate the bias of the heat distribution inside the integrated circuit device 20, it is optimal to arrange the heating element 30 near a center inside the integrated circuit device 20 in an XY plane.

However, usually, other elements are often arranged near the center of the integrated circuit device 20, and if the heating element 30 is arranged near the center, there is also a problem that wire bonding increases and assembly becomes difficult. Due to such circumstances, the heating element 30 needs to be arranged at the end of the integrated circuit device 20 in many cases. The arrangement according to the present embodiment is useful means for examining a shape and an arrangement direction of the heating element 30 in such a case.

2. Detailed Configuration Example of Integrated Circuit Device

Figure 5:
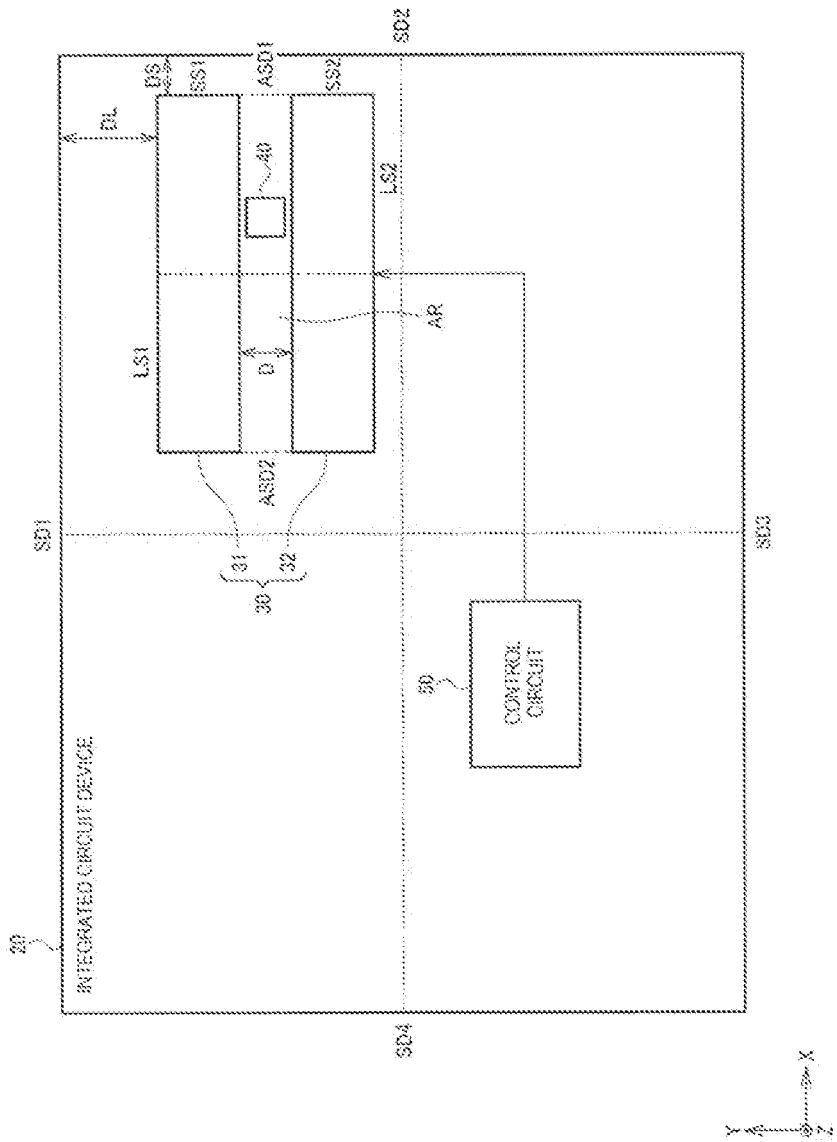
FIG. 5 shows a detailed first configuration example of the integrated circuit device.

FIG. 5 shows a detailed first configuration example of the integrated circuit device 20. In FIG. 5, the integrated circuit device 20 includes the heating element 30, a temperature sensor 40 that detects a temperature of the heating element 30, and the control circuit 50.

The heating element 30 includes a first heating element 31 and a second heating element 32. Specifically, the heating element 30 includes the first heating element 31, and the second heating element 32 arranged adjacent to the first heating element 31 along the Y direction with a region AR interposed therebetween. The first heating element 31 and the second heating element 32 are arranged apart from each other by a predetermined distance along the Y direction. The predetermined distance is, for example, about 20 µm. An outer shape of the first heating element 31 has a long side LS1 and a short side SS1. In addition, an outer shape of the second heating element 32 has a long side LS2 and a short side SS2. The short side SS1 and the short side SS2 are, for example, about 180 µm. In the first heating element 31, the long side LS1 is desirably at least twice the short side SS1. In the second heating element 32, the long side LS2 is also desirably at least twice the short side SS2. Further, as in FIG. 1, the distance DL is larger than the distance DS.

The first heating element 31 and the second heating element 32 are electrically coupled in parallel, and currents flowing through the first heating element 31 and the second heating element 32 that are coupled in parallel are controlled by an output signal of the control circuit 50. For example, since a first current flows through the first heating element 31 and a second current flows through the second heating element 32, a current obtained by adding the first current and the second current flows through the heating element 30.

The temperature sensor 40 is a sensor circuit that detects a temperature. Specifically, the temperature sensor outputs, as a temperature detection voltage, a temperature-dependent voltage that changes according to a temperature of the environment. For example, the temperature sensor 40 uses a circuit element having a temperature dependence to generate the temperature detection voltage. Specifically, the temperature sensor 40 outputs the temperature detection voltage, whose voltage value changes depending on a temperature, by using a temperature dependence of a forward voltage of a PN junction. For example, a voltage between the base and the emitter of the bipolar transistor can be used as the forward voltage of the PN junction. When a digital temperature compensation process is performed, the temperature sensor 40 measures a temperature such as an ambient temperature and outputs a measurement result as temperature detection data.

The temperature sensor 40 is provided to detect a temperature of the first heating element 31, the second heating element 32, and the surroundings thereof. The temperature sensor 40 is arranged at an arrangement position where a position in the X direction is a position between a center of the region AR and the second side SD2, and a position in the Y direction is a position between the first heating element 31 and the second heating element 32. For example, it is assumed that an X coordinate of the arrangement position of the temperature sensor 40 is XT, an X coordinate of the center of the region AR is XC, and an X coordinate of the second side SD2 is XS. In this case, for example, a relational expression of XC<XT<XS is established. In addition, it is assumed that a Y coordinate of the arrangement position of the temperature sensor 40 is YT, a Y coordinate of an opposite side of the long side LS1 of the first heating element 31 is Y1, and a Y coordinate of an opposite side of the long side LS2 of the second heating element 32 is Y2. In this case, for example, a relational expression of Y2<YT<Y1 is established.

The region AR is a region existing between the first heating element 31 and the second heating element 32. Specifically, the region AR is a region surrounded by a first region side ASD1, a second region side ASD2, the opposite side of the long side LS1 of the first heating element 31, and the opposite side of the long side LS2 of the second heating element 32. The center of the region AR is, for example, a position where a center line of the first region side ASD1 and the second region side ASD2 passes, and may be substantially the center of the region AR. The first region side ASD1 is a region side of an outer shape of the region AR, and is a side, in region sides parallel to the Y direction, which has a shortest distance to a side of the integrated circuit device 20 facing thereto. The second region side ASD2 is an opposite side of the first region side ASD1 in the outer shape of the region AR.

As in the first configuration example in FIG. 5, by dividing the heating element 30 into the first heating element 31 and the second heating element 32, the area in which the heating element 30 is in contact with the outside increases, and thus the heat dissipation is improved. In addition, by dividing the heating element 30 into the first heating element 31 and the second heating element 32, the region AR can be secured between the first heating element 31 and the second heating element 32, and the temperature sensor 40 can be arranged in this region AR. Although FIG. 5 shows an example in which the heating element 30 is divided into two heating elements, the heating element 30 may be divided into three or more heating elements.

Figure 6:
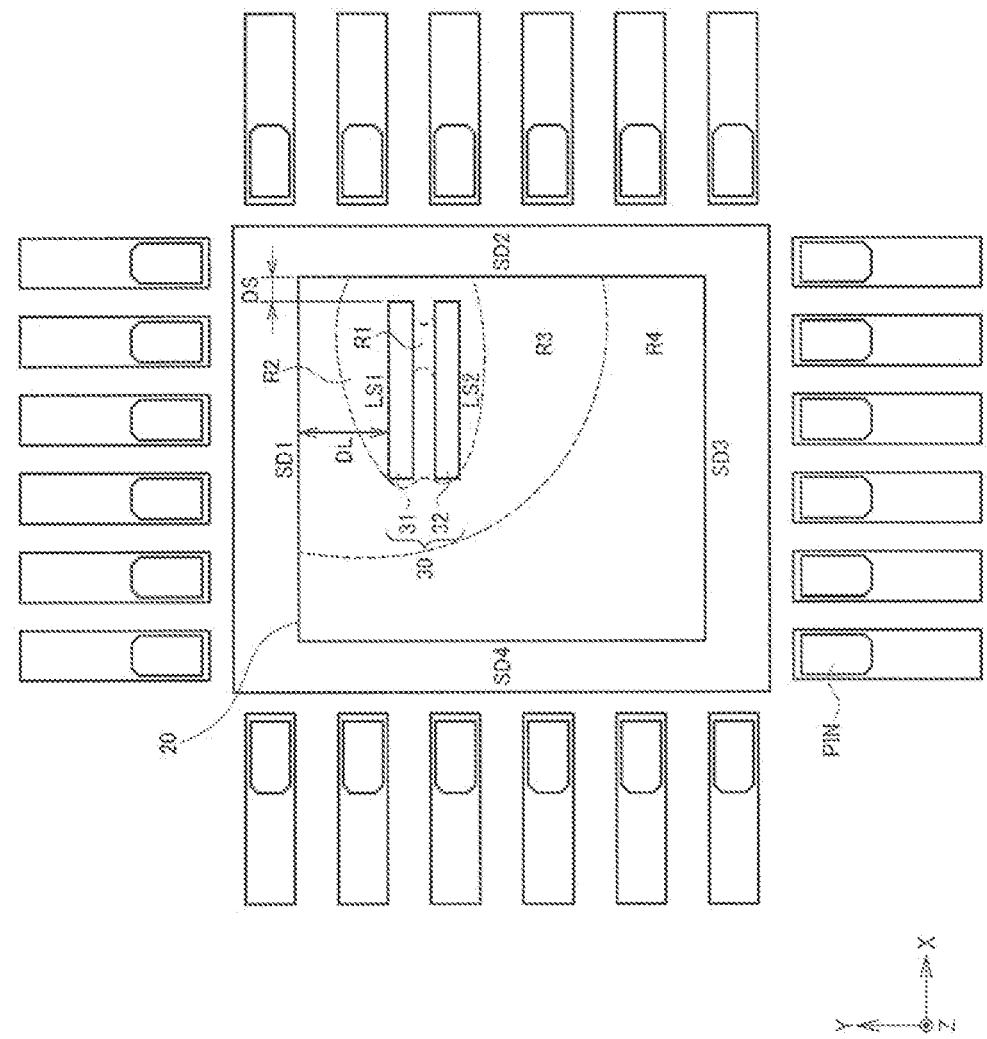
FIG. 6 is a schematic diagram showing heat distribution in a plane of an integrated circuit device which adopts the arrangement according to the present embodiment.

FIG. 6 is a diagram showing heat distribution in the XY plane after the heating element 30 starts to generate heat when the arrangement according to the present embodiment is applied. In FIG. 6, heat distribution when a certain period of time has elapsed from when the heating element 30 starts to release heat is simulated and regions are displayed as R1, R2, R3, and R4 in order from a region where the temperature is the highest. As shown in FIG. 6, R1 where the temperature is the highest is at a position closer to the second side SD2 than is the center of the region AR. Therefore, as shown in the first configuration example in FIG. 5, by arranging the temperature sensor 40 at a position closer to the second side SD2 than is the center in the X direction of the region AR, it is possible to appropriately detect an overheated state of the heating element 30.

Here, in order to quickly detect the overheated state, it is necessary to consider a temporal change at a position where a temperature is the highest in the integrated circuit device 20. A position where a temperature firstly becomes the highest after the start of heat generation appears in the center of the region AR. There is a mold resin on the outside of the second side SD2 and there is nowhere for heat to escape, and therefore, when a certain period of time has elapsed, the position where the temperature is the highest extends from the center of the region AR to the second side SD2 in the X direction. Therefore, in order to quickly detect the overheated state of the heating element 30 by the temperature sensor 40, it is desirable to arrange the temperature sensor 40 between the center of the region AR and the first region side ASD1 in the X direction in the region AR. This is because as compared with a case where an arrangement position of the temperature sensor 40 in the X direction is between the center of the region AR and the first region side ASD1, when the arrangement position of the temperature sensor 40 in the X direction is between the first region side ASD1 and the second side SD2, the detection of the overheated state may be delayed.

Figure 7:
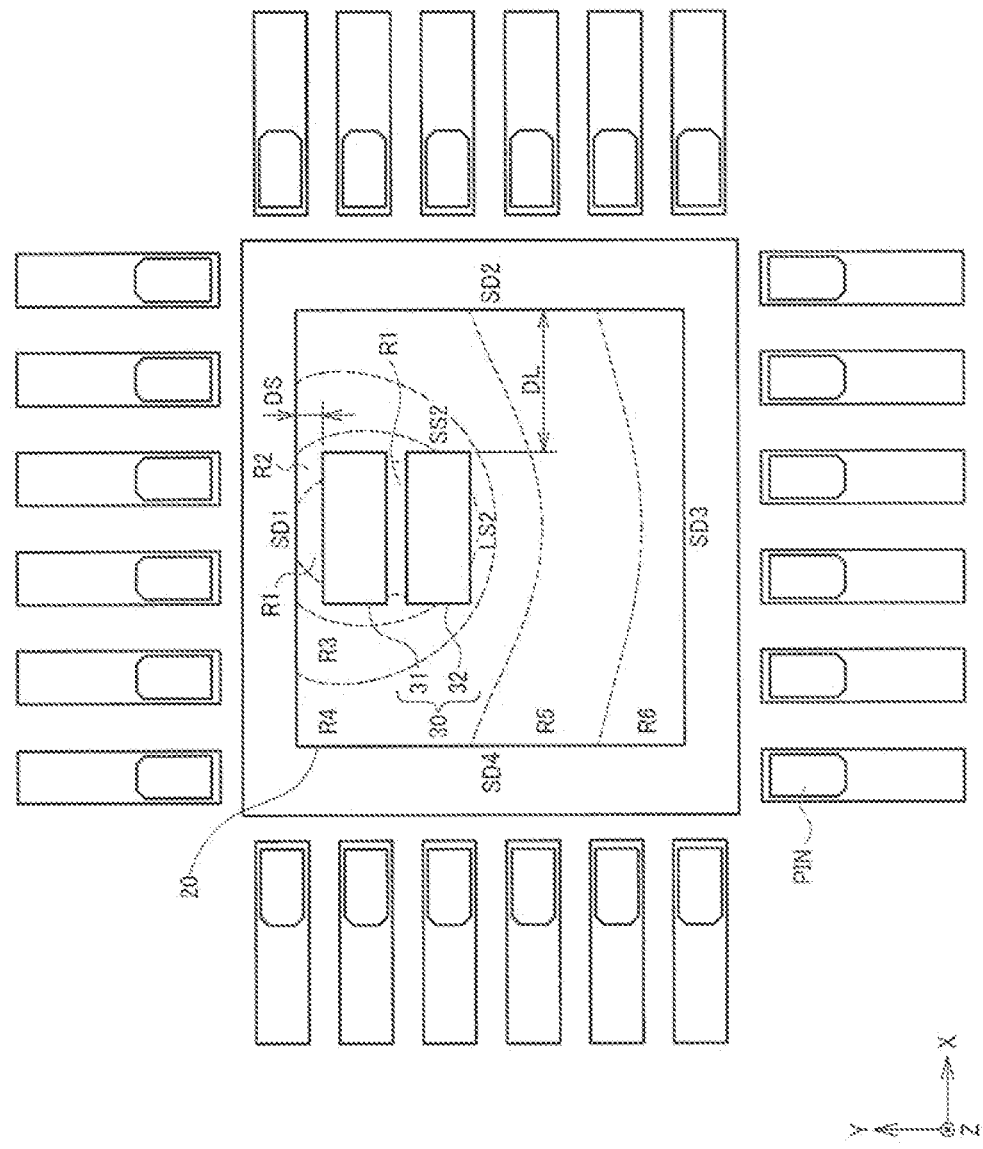
FIG. 7 is a schematic diagram showing heat distribution in the plane of the integrated circuit device which does not adopt the arrangement according to the present embodiment.

FIG. 7 is a diagram showing heat distribution in the XY plane after a certain period of time has elapsed after the heating element 30 starts to generate heat when the arrangement according to the present embodiment is not applied. In FIG. 7, regions are displayed as R1, R2, R3, R4, R5 and R6 in order from a region where the temperature is the highest. As compared with the case in FIG. 6 to which the arrangement according to the present embodiment is applied, it can be seen that in FIG. 7, R1 appears in a region between the first heating element 31 and the second heating element 32 and a region between the first heating element 31 and the first side SD1, and heat is unevenly distributed around the heating elements.

Figure 8:
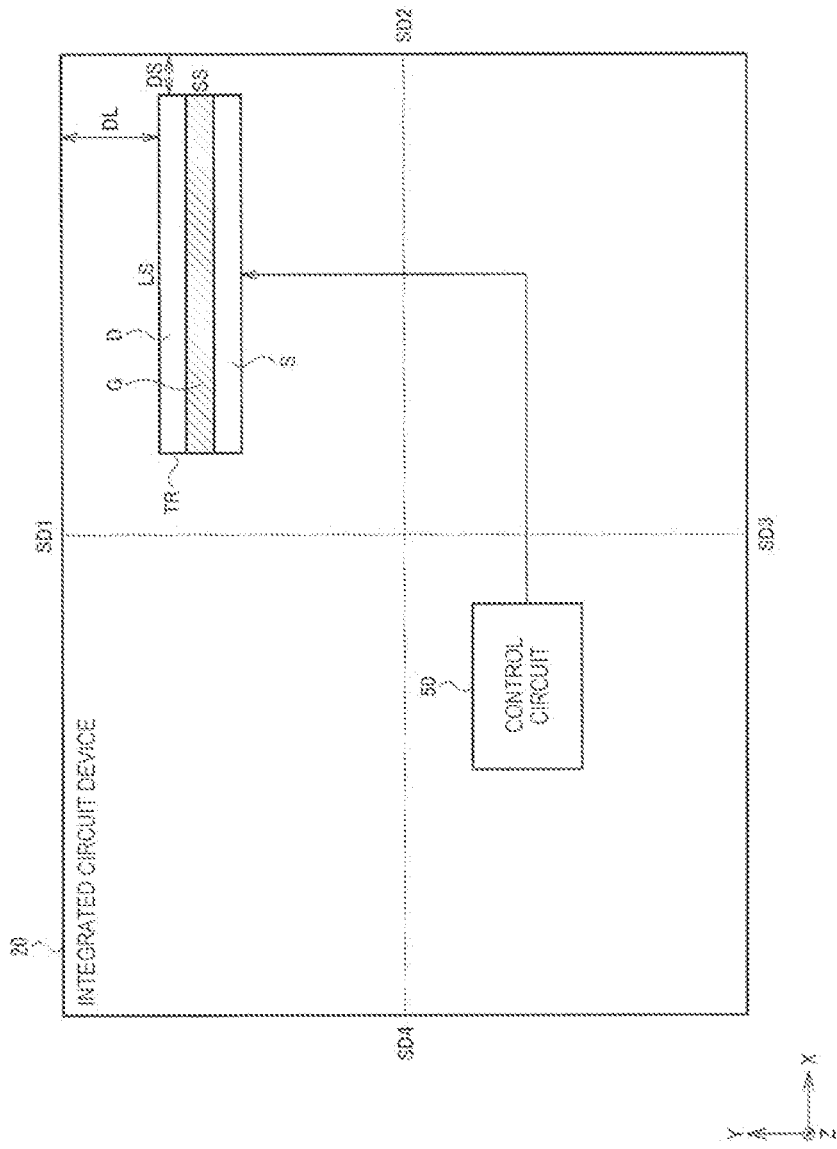
FIG. 8 shows a detailed second configuration example of the integrated circuit device.

FIG. 8 shows a detailed second configuration example of the integrated circuit device 20. The second configuration example in FIG. 8 is a configuration example when the heating element 30 in FIG. 1 is a transistor TR.

The transistor TR is controlled by the control circuit 50, and a current flows between a drain D and a source S, and thus heat is generated by the current flowing in this way. The transistor TR is, for example, a MOS transistor. The transistor TR may be an N-type MOS transistor or a P-type MOS transistor. The transistor TR here is arranged such that a longitudinal direction of a gate G is, for example, a direction along the X direction.

Similar to the basic configuration example shown in FIG. 1, in FIG. 8, the distance DL is larger than the distance DS. That is, a relationship of DL>DS is established. The distance DL is a distance between the long side LS of the transistor TR and the first side SD1 of the integrated circuit device 20 facing the long side LS. The distance DS is a distance between the short side SS of the transistor TR and the second side SD2 of the integrated circuit device 20 facing the short side SS.

The transistor TR is electrically coupled to the control circuit 50. The output signal of the control circuit 50 is input to the gate G of the transistor TR. The source S of the transistor TR is coupled to, for example, a ground node. The drain D of the transistor TR is coupled to, for example, a power supply voltage node. A well of the transistor TR is coupled to, for example, the ground node. Then, when a voltage of the output signal of the control circuit 50 is larger than a threshold voltage, a current flows from the drain D of the transistor TR to the source S thereof.

As described above, in the integrated circuit device 20, as compared with the arrangement in FIG. 2 in which DL=DS, in the arrangement in FIG. 3 in which DL>DS, the distance DL between the long side LS and the first side SD1 facing the long side LS is longer, and heat accumulation is less likely to occur. In addition, as compared with the case in FIG. 4 in which the outer shape of the heating element is a square, in FIGS. 2 and 3 in which the outer shape of the heating element in a plan view is a rectangle, the length of the outer periphery is longer, so that the heat dissipation of the heating element can be improved. These effects can also be similarly obtained when the heating element 30 is the transistor TR as in the second configuration example in FIG. 8.

The transistor TR is used, for example, for charging or discharging a load 300 described later. Thus, it is assumed that an amount of current flowing through the transistor TR is large and an amount of heat generated is also large. Therefore, when the transistor TR is provided as the heating element 30, occurrence of heat bias inside the integrated circuit device 20 can be prevented by setting a shape and an arrangement direction of the transistor TR as in the second configuration example.

Figure 9:
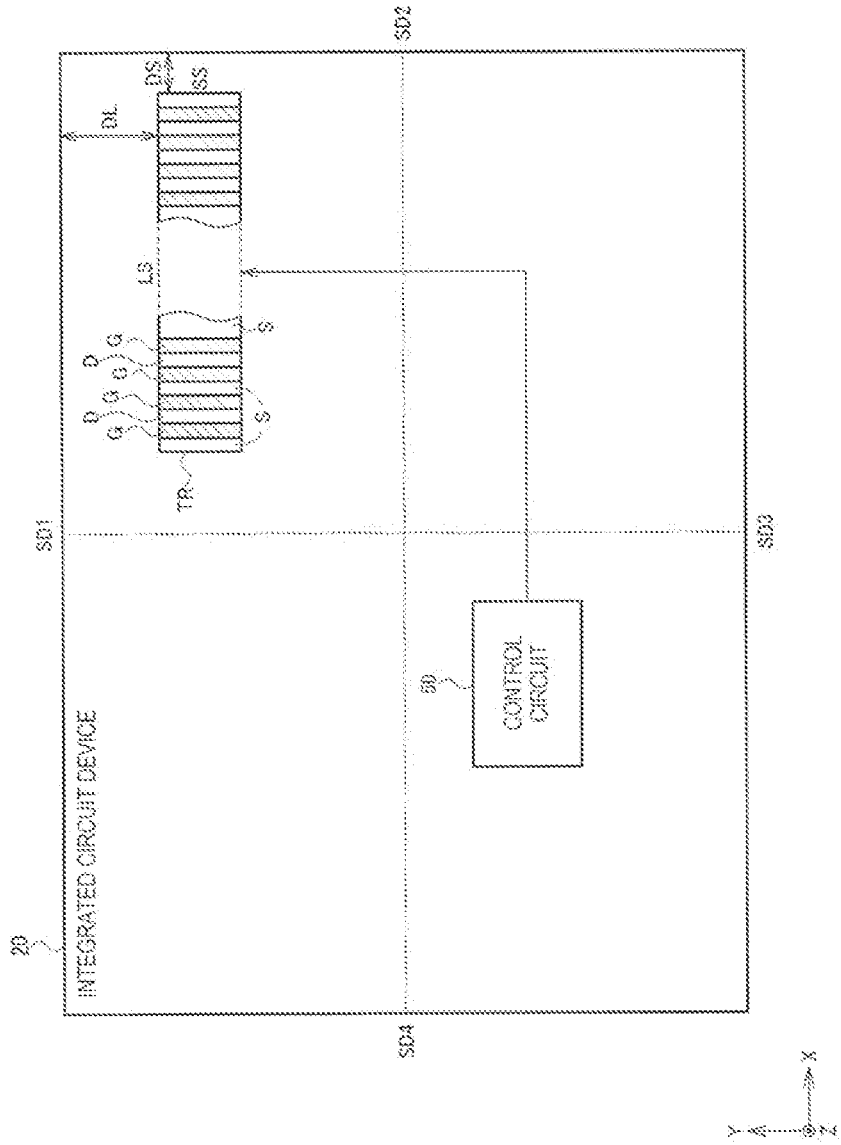
FIG. 9 shows a detailed third configuration example of the integrated circuit device.

FIG. 9 shows a detailed third configuration example of the integrated circuit device 20. In FIG. 9, the transistor TR shown in the second configuration example includes a plurality of unit transistors. For example, the transistor TR includes a plurality of unit transistors provided in parallel between a drain and a source of the transistor TR. Further, for example, the plurality of unit transistors are arranged adjacently in the X direction such that the longitudinal direction of the gate G of each unit transistor is parallel to the Y direction. In this case, a source of each unit transistor is the source S common to a source of an adjacent unit transistor. In addition, a drain of each unit transistor is also the drain D common to a drain of an adjacent unit transistor. An arrangement and a configuration of the unit transistors are not limited thereto.

Similar to the basic configuration example shown in FIG. 1, in FIG. 9, the distance DL is larger than the distance DS. That is, the relationship of DL>DS is established. The distance DL is a distance between the long side LS of the transistor TR and the first side SD1 of the integrated circuit device 20 facing the long side LS. The distance DS is a distance between the short side SS of the transistor TR and the second side SD2 of the integrated circuit device 20 facing the short side SS.

As described above, in the integrated circuit device 20, as compared with the arrangement in FIG. 2 in which DL=DS, in the arrangement in FIG. 3 in which DL>DS, the distance between the long side LS and the first side SD1 facing the long side LS is longer, and heat accumulation is less likely to occur. In addition, as compared with the case in FIG. 4 in which the outer shape of the heating element 30 is a square, in FIGS. 2 and 3 in which the outer shape of the heating element 30 in a plan view is a rectangle, the length of the outer periphery is longer, so that the heat dissipation of the heating element 30 can be improved. These effects can also be similarly obtained when the heating element 30 is the transistor TR including a plurality of unit transistors as in the third configuration example in FIG. 9.

By configuring the transistor TR with a plurality of unit transistors as in the third configuration example in FIG. 9, an amount of current of the transistor TR per same area can be increased as compared with the second configuration example in FIG. 8. That is, current supply capability can be improved. When the amount of current is increased in this way, an amount of heat generated per same area is also increased. Therefore, when the transistor TR includes a plurality of unit transistors, by setting arrangement directions and shapes of the unit transistors as in the third configuration example, occurrence of heat bias inside the integrated circuit device 20 can be effectively prevented. Further, by configuring the transistor TR with a plurality of unit transistors, a width W of a gate of each unit transistor can be reduced, and reliability can be improved.

Figure 10:
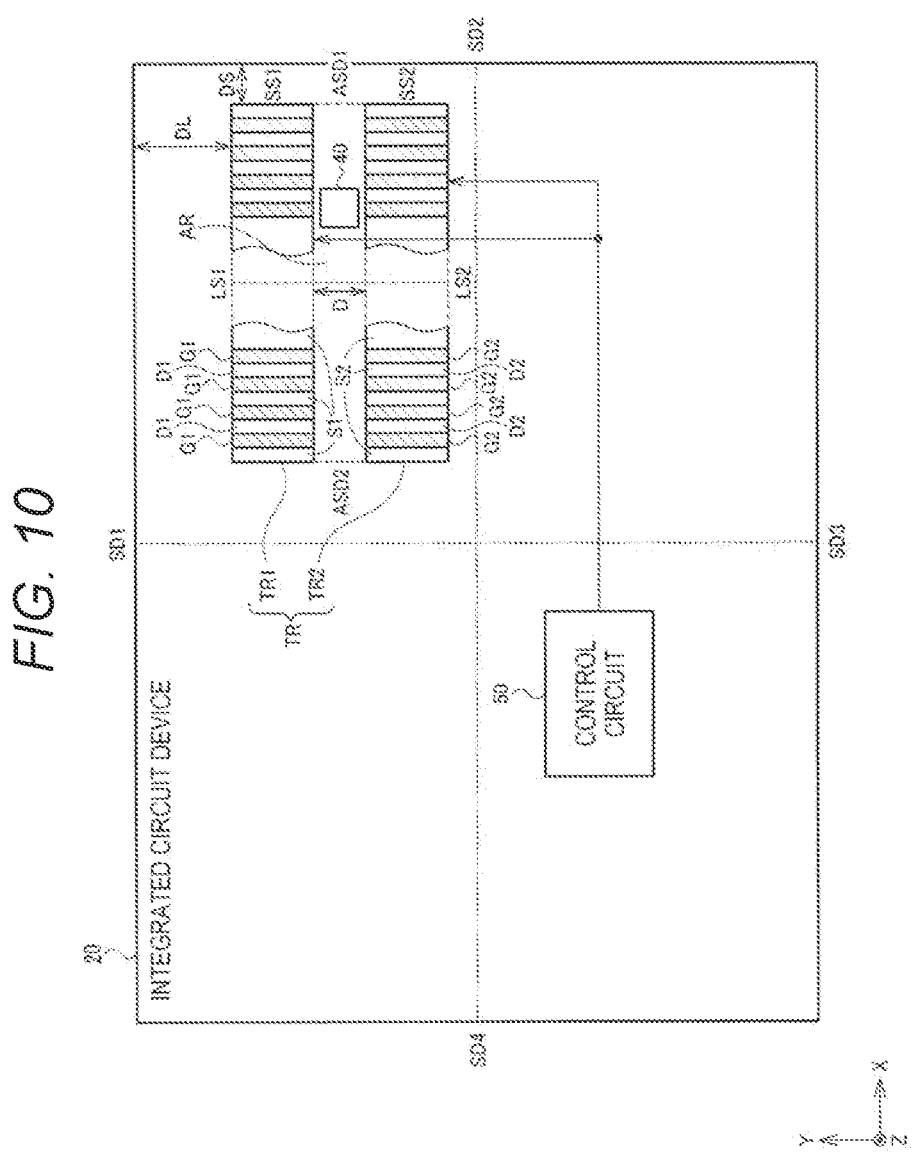

FIG. 10 shows a detailed fourth configuration example of the integrated circuit device 20. In FIG. 10, the integrated circuit device 20 includes the transistor TR, the temperature sensor 40, and the control circuit 50.

The transistor TR includes a first transistor TR1 and a second transistor TR2. Specifically, the transistor TR includes the first transistor TR1, and the second transistor TR2 arranged adjacent to the first transistor TR1 along the Y direction with the region AR interposed therebetween. The first transistor TR1 and the second transistor TR2 are arranged apart from each other by a predetermined distance along the Y direction. An outer shape of the first transistor TR1 has the long side LS1 and the short side SS1. In addition, an outer shape of the second transistor TR2 has the long side LS2 and the short side SS2. In the first transistor TR1, the long side LS1 is desirably at least twice the short side SS1. In the second transistor TR2, the long side LS2 is also desirably at least twice the short side SS2.

Similar to the basic configuration example shown in FIG. 1, in FIG. 10, the distance DL is larger than the distance DS. The distance DL is a shorter distance in distances between the long sides of the transistor TR and a side of the integrated circuit device 20 facing the long sides. In FIG. 10, the distance DL is a distance between the long side LS1 and the first side SD1. The distance DS is a shorter distance in distances between the short sides of the transistor TR and a side of the integrated circuit device 20 facing the short sides. In FIG. 10, the distance DS is a distance between the short sides SS1 and SS2 and the second side SD2.

The first transistor TR1 and the second transistor TR2 are electrically coupled in parallel. For example, in the first transistor TR1 and the second transistor TR2, sources thereof are coupled to each other and drains thereof are coupled to each other. The first transistor TR1 and the second transistor TR2 are controlled by the output signal of the control circuit 50. The first transistor TR1 may include a plurality of unit transistors. The second transistor TR2 may also include a plurality of unit transistors.

The temperature sensor 40 is provided to detect a temperature of the first transistor TR1, the second transistor TR2, and the surroundings thereof. The temperature sensor 40 is arranged at an arrangement position where a position in the X direction is a position between the center of the region AR and the second side SD2, and a position in the Y direction is a position between the first transistor TR1 and the second transistor TR2.

Here, the region AR is a region existing between the first transistor TR1 and the second transistor TR2, and is a region surrounded by the first region side ASD1, the second region side ASD2, the opposite side of the long side LS1 of the first transistor TR1, and the opposite side of the long side LS2 of the second transistor TR2. The first region side ASD1 is a side of the outer shape of the region AR, and is a side, in sides parallel to the Y direction, which has a shortest distance to a side of the integrated circuit device 20 facing thereto. The second region side ASD2 is the opposite side of the first region side ASD1 in the outer shape of the region AR.

In the fourth configuration example, when the transistor TR is divided into the first transistor TR1 and the second transistor TR2, an area in which the transistor TR is in contact with the outside increases, and thus the heat dissipation is improved. Further, when the transistor TR is divided, the region AR can be secured, and the temperature sensor 40 can be arranged in this area AR.

The heat distribution in the XY plane after the transistor TR starts to generate heat can be considered by respectively replacing the first heating element 31 and the second heating element 32 in FIG. 6 with the first transistor TR1 and the second transistor TR2. That is, in the fourth configuration example, in order to detect an overheated state of the transistor TR, it is necessary to arrange the temperature sensor 40 at least at a position closer to the second side SD2 than is the center of the region AR in the X direction, and in order to quickly detect the overheated state of the transistor TR, it is desirable to arrange the temperature sensor 40 between a center of the long side LS in the X direction and the first region side ASD1 in the region AR.

Figure 11:
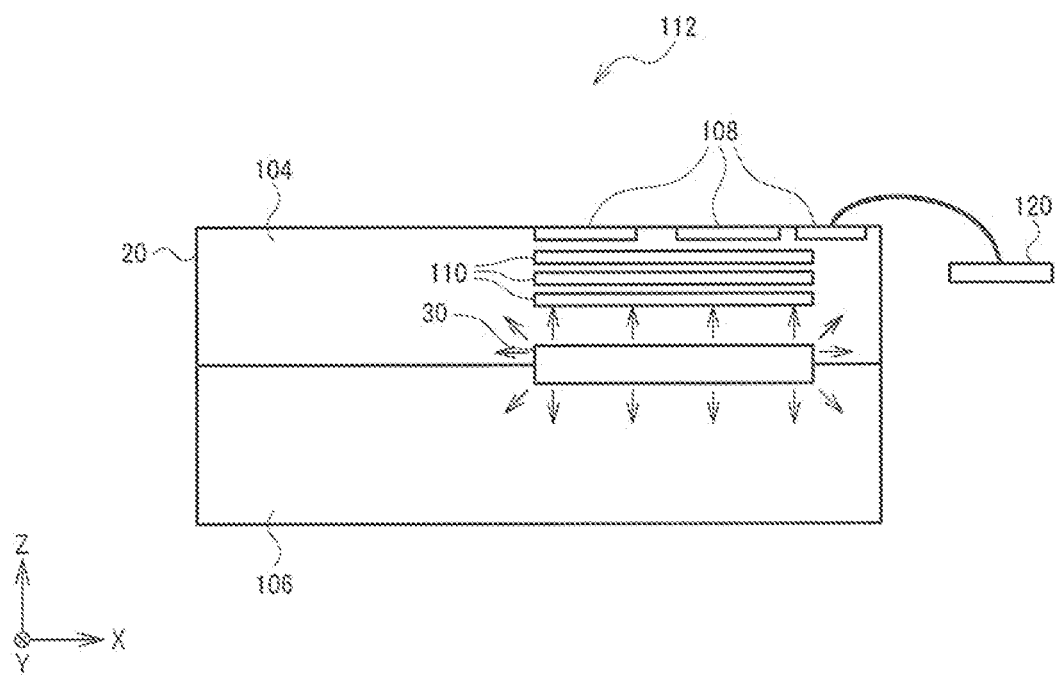
FIG. 11 shows a detailed fifth configuration example of the integrated circuit device.

FIG. 11 shows a detailed fifth configuration example of the integrated circuit device 20. In the integrated circuit device 20 of the fifth configuration example, in the integrated circuit devices 20 of the first configuration example to the fourth configuration example, a dummy metal wiring or a dummy pad is provided at an upper layer of the heating element 30 or the transistor TR. 120 in FIG. 11 represents a terminal and corresponds to a PIN in FIGS. 6 and 7.

A metal wiring 110 is provided as a dummy. The metal wiring 110 can be implemented by, for example, a metal such as aluminum or an aluminum alloy, but is not limited thereto. The metal wiring 110 is implemented by a method of forming a wiring pattern by etching after forming a solid metal film, or a method of embedding a metal after processing a base of a wiring pattern. The metal wiring 110 may be used for actual circuit driving or the like.

A pad 108 is provided as a dummy. The pad 108 can be implemented by, for example, a metal such as aluminum or an aluminum alloy, but is not limited thereto. The pad 108 is implemented by a method of forming a wiring pattern by etching after forming a solid metal film, or a method of embedding a metal after processing a base of a wiring pattern. The pad 108 may be used for actual circuit driving or the like.

FIG. 11 is a schematic diagram of, for example, the integrated circuit device 20 in FIG. 1 as viewed from a cross section of an X-Z plane. In a +Z direction viewed from the heating element 30, there are a metal wiring, polycrystalline silicon doped with impurities, and an insulating film such as a silicon oxide. In a −Z direction viewed from the heating element 30, there is basically single crystal silicon doped with impurities.

Figure 12:
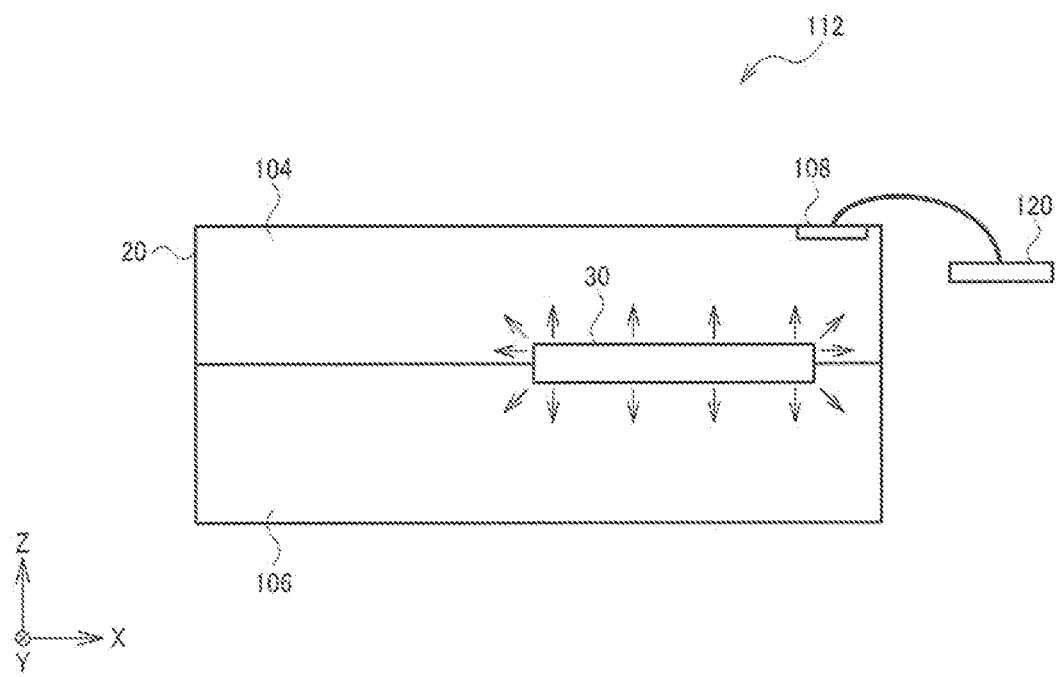
FIG. 12 shows a configuration example as a comparative example of the fifth configuration example.

Since the insulating film such as a silicon oxide in the +Z direction viewed from the heating element 30 generally has lower thermal conductivity than the metal wiring and the polycrystalline silicon, heat from the heating element 30 or the transistor TR is accumulated in a structure in which there is no metal wiring in the +Z direction as shown in FIG. 12, which shows a comparative example of the fifth configuration example. Therefore, as in the fifth configuration example shown in FIG. 11, by arranging a metal wiring or a pad having high thermal conductivity, a situation where the heat is accumulated in the +Z direction can be solved.

In the present embodiment, the heating element 30 may be divided into three or more parts. For example, when the heating element 30 is the transistor TR, the transistor TR may be divided into three or more parts. As the number of divisions of the heating element increases, the area in contact with the outside increases, and heat dissipation of heat from the heating element 30 and the transistor TR is improved.

Figure 13:
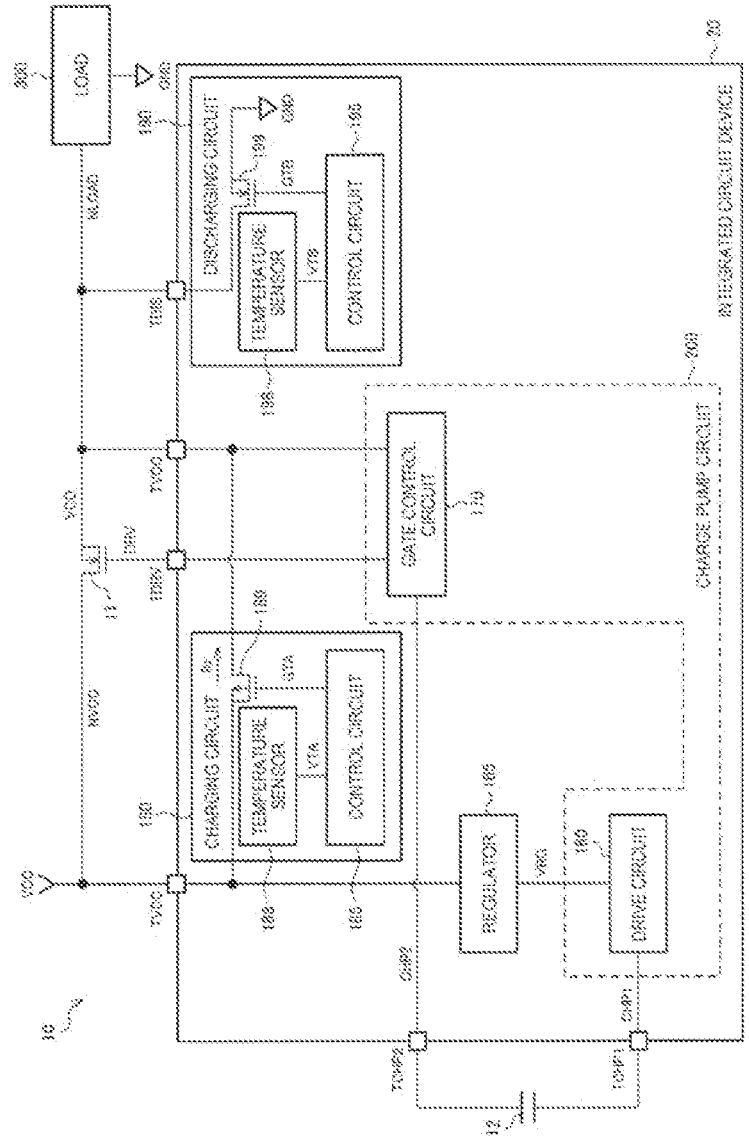
FIG. 13 shows a specific circuit configuration example of the integrated circuit device and an electronic device.

FIG. 13 is a diagram showing a specific circuit configuration example of the integrated circuit device 20 and an electronic device 10 including the integrated circuit device 20. The electronic device 10 includes an external transistor 11, the load 300, and the integrated circuit device 20. Hereinafter, an example in which the external transistor 11 is an N-type transistor will be mainly described, but the present disclosure is not limited thereto, and the external transistor 11 may be a P-type transistor.

The electronic device 10 may be, for example, a printing device, a video projection device, a wearable device, an information processing device, a display device, a television receiver, a portable information terminal, or the like, but is not limited thereto, and may be various devices using a direct-current power supply voltage VCC.

The external transistor 11 is provided between a power supply node NVCC and the load 300. Specifically, a drain of the external transistor 11 is coupled to the power supply node NVCC, and a source is coupled to a node NLOAD of the load 300. The external transistor 11 is a so-called power transistor, supplies the power supply voltage VCC to the load 300 when the external transistor 11 is on, and cuts off the supply of the power supply voltage VCC to the load 300 when the external transistor 11 is off.

The power supply voltage VCC is supplied to the power supply node NVCC from a direct current power supply. The direct current power supply is, for example, an AC-DC converter, a DC-DC converter or a battery. Although not shown in FIG. 13, these direct current power supplies may be provided in the electronic device 10.

The load 300 is a circuit operated by the power supply voltage VCC supplied to the node NLOAD via the external transistor 11. The node NLOAD is a power supply node of the load 300. The load 300 is, for example, a power supply stabilizing capacitor provided between the node NLOAD and a ground voltage GND, a processing device that executes processing in the electronic device 10, or a motor driver that drives a motor. The load 300 is not limited thereto, and may be a circuit that realizes various functions in the electronic device 10.

The integrated circuit device 20 controls the supply of the power supply voltage VCC to the load 300 by outputting a gate control voltage DRV to a gate of the external transistor 11. The integrated circuit device 20 includes a regulator 165, a charge pump circuit 200, a charging circuit 180, a discharging circuit 190, and terminals TCHP1, TCHP2, TVCC, TDRV, TVCO, and TDIS. The integrated circuit device 20 is, for example, an integrated circuit device in which a plurality of circuit elements are integrated on a semiconductor substrate. Each terminal is, for example, a pad of the integrated circuit device or a terminal of a package for accommodating the integrated circuit device.

The regulator 165 regulates the power supply voltage VCC from the power supply node NVCC to output a regulated voltage VRG. The terminal TVCC is coupled to the power supply node NVCC, and the power supply voltage VCC is supplied to the regulator 165 via the terminal TVCC. The regulator 165 is a buck regulator that outputs the regulated voltage VRG lower than the power supply voltage VCC. The regulator 165 is, for example, a linear regulator, but is not limited thereto, and may be various types of DC-DC converters.

The charge pump circuit 200 outputs a gate control voltage DRV=VCO+VRG higher than a source voltage VCO by boosting a voltage based on the regulated voltage VRG with reference to the source voltage VCO of the external transistor 11. Accordingly, when the charge pump circuit 200 is operating, since the external transistor 11 is turned on, the power supply voltage VCC is supplied to the load 300 via the external transistor 11.

Specifically, one end of a boosting capacitor 12 is coupled to the terminal TCHP1, the other end of the boosting capacitor 12 is coupled to the terminal TCHP2, and the gate of the external transistor 11 is coupled to the terminal TDRV. The charge pump circuit 200 includes a drive circuit 160 and a gate control circuit 170. The drive circuit 160 outputs a drive signal CHP1 to the one end of the boosting capacitor 12 based on the regulated voltage VRG. A signal CHP2 from the other end of the boosting capacitor 12 is input to the gate control circuit 170. The gate control circuit 170 outputs the gate control voltage DRV=VCO+VRG based on the signal CHP2 and the source voltage VCO of the external transistor 11. The gate control voltage DRV is output to the gate of the external transistor 11 via the terminal TDRV.

When the external transistor 11 is a P-type transistor, the source voltage of the external transistor 11 is the power supply voltage VCC. The charge pump circuit 200 may output a gate control voltage DRV=VCC−VRG lower than the power supply voltage VCC by reducing a voltage based on the regulated voltage VRG with reference to the power supply voltage VCC.

A transistor 189 is provided between the power supply node NVCC and the node NLOAD. Specifically, the transistor 189 is a P-type transistor, a source thereof is coupled to the terminal TVCC and a drain thereof is coupled to the terminal TVCO. The terminal TVCO is a terminal coupled to the source of the external transistor 11 and the node NLOAD. Although FIG. 13 shows an example in which the transistor 189 is a P-type transistor, the transistor 189 may be an N-type transistor. Further, the transistor 189 in FIG. 13 corresponds to a charging transistor TRC in FIG. 14 described later.

A temperature sensor 188 detects a temperature of the transistor 189 and outputs a temperature detection voltage VTA whose voltage value changes according to the detected temperature. The temperature sensor 188 is arranged in the vicinity of the transistor 189 such that the temperature of the transistor 189 can be detected. The temperature sensor 188 is, for example, a temperature sensor using a temperature dependence of a forward voltage of a PN junction, but is not limited thereto, and may be various types of temperature sensors.

A control circuit 185 controls a transistor current by controlling a gate voltage GTA of the transistor 189. A transistor current in the charging circuit 180 is a current flowing through the transistor 189. The control circuit 185 controls the transistor current based on the temperature detection voltage VTA to avoid a failure caused by heat generation of the transistor 189. Further, the control circuit 185 performs control such that the transistor current flows as much as possible within a range in which the transistor 189 can be maintained at an allowable temperature or lower.

The discharging circuit 190 discharges a capacitor of the node NLOAD of the load 300 after the external transistor 11 is turned off. Accordingly, after the external transistor 11 is turned off, a malfunction caused by a voltage held in the capacitor of the node NLOAD or charges accumulated in the capacitor of the node NLOAD can be prevented. The discharging circuit 190 includes a transistor 199, a temperature sensor 198, and a control circuit 195.

The transistor 199 is provided between the node NLOAD and a ground node. Specifically, the transistor 199 is an N-type transistor, a source thereof is coupled to the ground node and a drain thereof is coupled to the terminal TDIS. The terminal TDIS is a terminal coupled to the node NLOAD of the load 300. The transistor 199 in FIG. 13 corresponds to a discharging transistor TRD in FIG. 14 described later.

The temperature sensor 198 detects a temperature of the transistor 199 and outputs a temperature detection voltage VTB whose voltage value changes according to the detected temperature. The temperature sensor 198 is arranged in the vicinity of the transistor 199 such that the temperature of the transistor 199 can be detected. The temperature sensor 198 is, for example, a temperature sensor using a temperature dependence of a forward voltage of a PN junction, but is not limited thereto, and may be various types of temperature sensors. The temperature sensors 188 and 198 in FIG. 13 correspond to the temperature sensor 40 in FIGS. 5 and 10, a first temperature sensor 41 and a second temperature sensor 42 in FIG. 14.

The control circuit 195 controls a transistor current by controlling a gate voltage GTB of the transistor 199. A transistor current in the discharging circuit 190 is a current flowing through the transistor 199. The control circuit 195 controls the transistor current based on the temperature detection voltage VTB to avoid a failure caused by heat generation of the transistor 199. Further, the control circuit 195 performs control such that the transistor current flows as much as possible within a range in which the transistor 199 can be maintained at an allowable temperature or lower. The details of the control will be described later. The control circuits 185 and 195 in FIG. 13 correspond to the control circuit 50 in FIGS. 1, 5, 8, 9, 10, and 14.

Figure 14:
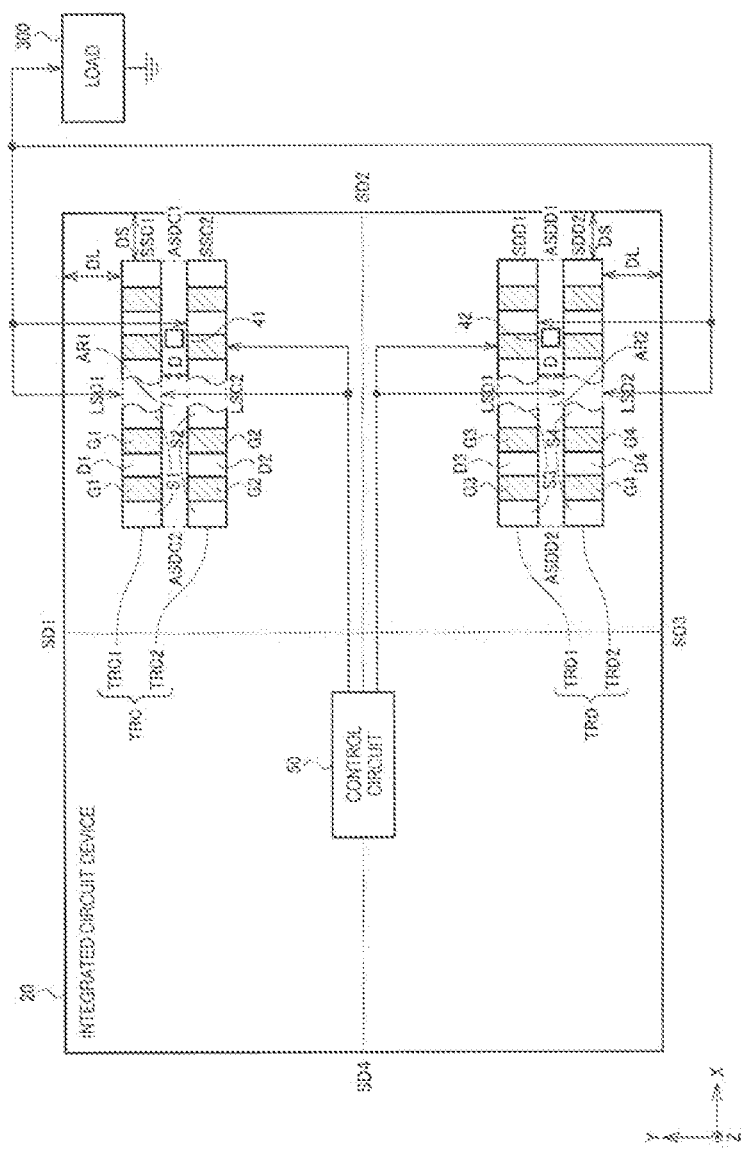
FIG. 14 shows a detailed sixth configuration example of the integrated circuit device.

FIG. 14 shows a detailed sixth configuration example of the integrated circuit device 20. FIG. 14 corresponds to the configuration example in FIG. 13. The integrated circuit device 20 includes the charging transistor TRC, the discharging transistor TRD, the first temperature sensor 41, the second temperature sensor 42, and the control circuit 50.

A current for charging the load 300 flows through, for example, the charging transistor TRC. Heat is generated by the current flowing through the charging transistor TRC. The charging transistor TRC includes a first charging transistor TRC1 and a second charging transistor TRC2.

Specifically, the charging transistor TRC includes the first charging transistor TRC1, and the second charging transistor TRC2 arranged adjacent to the first charging transistor TRC1 along the Y direction with a first region AR1 interposed therebetween. The first charging transistor TRC1 and the second charging transistor TRC2 are arranged apart from each other by a predetermined distance along the Y direction. An outer shape of the first charging transistor TRC1 has a first long side LSC1 and a first short side SSC1. In addition, an outer shape of the second charging transistor TRC2 has a first long side LSC2 and a first short side SSC2. In the first charging transistor TRC1, a length of the first long side LSC1 is desirably at least twice a length of the first short side SSC1. In the second charging transistor TRC2, a length of the first long side LSC2 is also desirably at least twice a length of the first short side SSC2. Further, the distance DL is larger than the distance DS.

The first charging transistor TRC1 and the second charging transistor TRC2 are implemented by, for example, P-type MOS transistors or N-type MOS transistors. The first charging transistor TRC1 includes a plurality of unit transistors arranged such that a longitudinal direction of a gate G1 of each unit transistor is, for example, a direction along the Y direction, and the second charging transistor TRC2 includes a plurality of unit transistors arranged such that a longitudinal direction of a gate G2 of each unit transistor is, for example, a direction along the Y direction.

The first charging transistor TRC1 and the second charging transistor TRC2 are electrically coupled in parallel, for example. The output signal of the control circuit 50 is input to the gate G1 of the first charging transistor TRC1 and the gate G2 of the second charging transistor TRC2. A source S1 of the first charging transistor TRC1 and a source S2 of the second charging transistor TRC2 are coupled to, for example, a ground node. A drain D1 of the first charging transistor TRC1 and a drain D2 of the second charging transistor TRC2 are coupled to, for example, a power supply voltage node.

A current for discharging the load 300 flows through, for example, the discharging transistor TRD. Heat is generated by the current flowing through the discharging transistor TRD. The discharging transistor TRD includes a first discharging transistor TRD1 and a second discharging transistor TRD2.

Specifically, the discharging transistor TRD includes the first discharging transistor TRD1, and the second discharging transistor TRD2 arranged adjacent to the first discharging transistor TRD1 along the Y direction with a second region AR2 interposed therebetween. The first discharging transistor TRD1 and the second discharging transistor TRD2 are arranged apart from each other by a predetermined distance along the Y direction. An outer shape of the first discharging transistor TRD1 has a second long side LSD1 and a second short side SSD1. In addition, an outer shape of the second discharging transistor TRD2 has a second long side LSD2 and a second short side SSD2. In the first discharging transistor TRD1, a length of the second long side LSD1 is desirably at least twice a length of the second short side SSD1. In the second discharging transistor TRD2, a length of the second long side LSD2 is also desirably at least twice a length of the second short side SSD2. Further, the distance DL is larger than the distance DS.

The first discharging transistor TRD1 and the second discharging transistor TRD2 are implemented by, for example, P-type MOS transistors or N-type MOS transistors. The first discharging transistor TRD1 includes a plurality of unit transistors arranged such that a longitudinal direction of a gate G3 of each unit transistor is, for example, a direction along the Y direction, and the second discharging transistor TRD2 includes a plurality of unit transistors arranged such that a longitudinal direction of a gate G4 of each unit transistor is, for example, a direction along the Y direction.

The first discharging transistor TRD1 and the second discharging transistor TRD2 are electrically coupled in parallel, for example. The output signal of the control circuit 50 is input to the gate G3 of the first discharging transistor TRD1 and the gate G4 of the second discharging transistor TRD2. A source S3 of the first discharging transistor TRD1 and a source S4 of the second discharging transistor TRD2 are coupled to, for example, a ground node. A drain D3 of the first discharging transistor TRD1 and a drain D4 of the second discharging transistor TRD2 are coupled to, for example, a power supply voltage node.

The first temperature sensor 41 and the second temperature sensor 42 correspond to the temperature sensor 40 shown in FIGS. 5 and 10, and are sensor circuits that detect temperatures. The first temperature sensor 41 is provided to detect a temperature of the first charging transistor TRC1, the second charging transistor TRC2, and the surroundings thereof. The first temperature sensor 41 is arranged at an arrangement position where a position in the X direction is a position between a center of the first region AR1 and the second side SD2, and a position in the Y direction is a position between the first charging transistor TRC1 and the second charging transistor TRC2.

Specifically, an outer shape of the first region AR1 between the first charging transistor TRC1 and the second charging transistor TRC2 has a first region side ASDC1 close to the second side SD2 and a second region side ASDC2 farther from the second side SD2 than is the first region side ASDC1. The first temperature sensor 41 is arranged between the center of the first region AR1 and the first region side ASDC1.

The first region AR1 is a region existing between the first charging transistor TRC1 and the second charging transistor TRC2. The first region side ASDC1 is a side of the outer shape of the first region AR1, and is a side, in sides parallel to the Y direction, which has a shortest distance to a side of the integrated circuit device 20 facing thereto. The second region side ASDC2 is an opposite side of the first region side ASDC1 in the outer shape of the first region AR1.

The second temperature sensor 42 is provided to detect a temperature of the first discharging transistor TRD1, the second discharging transistor TRD2, and the surroundings thereof. The second temperature sensor 42 is arranged at an arrangement position where a position in the X direction is a position between a center of the second region AR2 and the second side SD2, and a position in the Y direction is a position between the first discharging transistor TRD1 and the second discharging transistor TRD2.

Specifically, an outer shape of the second region AR2 between the first discharging transistor TRD1 and the second discharging transistor TRD2 has a third region side ASDD1 close to the second side SD2 and a fourth region side ASDD2 farther from the second side SD2 than is the third region side ASDD1. Then, the second temperature sensor 42 is arranged between the center of the second region AR2 and the third region side ASDD1.

Here, the second region AR2 is a region existing between the first discharging transistor TRD1 and the second discharging transistor TRD2. The third region side ASDD1 is a side of the outer shape of the second region AR2, and is a side, in sides parallel to the Y direction, which has a shortest distance to a side of the integrated circuit device 20 facing thereto. The fourth region side ASDD2 is an opposite side of the third region side ASDD1 in the outer shape of the second region AR2.

The control circuit 50 is a circuit that controls a current flowing through, for example, the charging transistor TRC and the discharging transistor TRD. The control circuit 50 is implemented by, for example, a logic circuit. The control circuit 50 controls the current flowing through the charging transistor TRC and the discharging transistor TRD by controlling gates of the charging transistor TRC and the discharging transistor TRD which are MOS transistors.

In the first charging transistor TRC1, the length of the first long side LSC1 is substantially at least twice the length of the first short side SSC1. In the second charging transistor TRC2, the length of the first long side LSC2 is substantially at least twice the length of the first short side SSC2.

In the first discharging transistor TRD1, the length of the second long side LSD1 is substantially at least twice the length of the second short side SSD1. In the second discharging transistor TRD2, the length of the second long side LSD2 is substantially at least twice the length of the second short side SSD2.

The charging transistor TRC and the discharging transistor TRD are respectively arranged at positions where DL>DS. That is, in the charging transistor TRC, a distance between the first side SD1 and the first long side LSC1 is longer than a distance between the second side SD2 and the first short sides SSC1 and SSC2, and in the discharging transistor TRD, a distance between the third side SD3 and the second long side LSD2 is longer than a distance between the second side SD2 and the second short sides SSD1 and SSD2.

As mentioned above, since each of the charging transistor TRC and the discharging transistor TRD respectively has a long side and a short side, the heat dissipation can be improved, and by arranging the charging transistor TRC and the discharging transistor TRD such that DL>DS, the heat bias inside the integrated circuit device 20 can be reduced.

A position where the temperature is the highest changes with the elapse of time from the center of the first region AR1 to the second side SD2 side. Therefore, as long as a position of the first temperature sensor 41 in the X direction is limited to a region from the center of the first region AR1 to the first region side ASDC1, it is possible to detect the overheated state at an early stage, and avoid a decrease in the capacity or a malfunction of a peripheral element including the charging transistor TRC.

Similarly, as long as a position of the second temperature sensor 42 in the X direction is limited to a region from the center of the second region AR2 to the third region side ASDD1, it is possible to detect the overheated state at an early stage, and avoid a decrease in capacity or a malfunction of a peripheral element including the discharging transistor TRD.

As described above, the integrated circuit device according to the present embodiment includes a heating element and a control circuit configured to control flow of a current through the heating element. An outer shape of the heating element has a short side and a long side, and an outer shape of the integrated circuit device has a first side and a second side intersecting the first side. A distance between the long side of the heating element and the first side of the integrated circuit device is larger than a distance between the short side of the heating element and the second side of the integrated circuit device.

According to the present embodiment, by setting the outer shape of the heating element into a shape having a long side and a short side, an area in which the heating element is in contact with the outside is increased, and the heat dissipation can be improved. Further, by arranging the heating element such that the distance between the long side of the heating element and the first side of the integrated circuit device is larger than the distance between the short side of the heating element and the second side of the integrated circuit device, it is also possible to prevent heat from being accumulated in a narrow region between the heating element and a side of the integrated circuit device facing the heating element with a closest distance, and to avoid the occurrence of heat bias inside the integrated circuit device.

Further, in the present embodiment, a length of the long side of the heating element may be at least twice a length of the short side.

In this way, if a ratio of the length of the long side to the length of the short side of the outer shape of the heating element is substantially set to 2 or more, an effect of improving the heat dissipation of the heating element is remarkable.

Further, in the present embodiment, the integrated circuit device further includes a temperature sensor configured to detect a temperature of the heating element, and when a direction along the first side of the integrated circuit device is set as an X direction and a direction along the second side is set as a Y direction, the heating element may include a first heating element, and a second heating element arranged adjacent to the first heating element along the Y direction with a region interposed therebetween. The temperature sensor may be arranged at an arrangement position where a position in the X direction is a position between a center of the region and the second side, and a position in the Y direction is a position between the first heating element and the second heating element.

In this way, since the temperature sensor is arranged at a position closer to the second side than is the center of the region where the temperature is the highest, it is possible to reliably detect the overheated state and prevent occurrence of a malfunction caused by overheating of the heating element.

Further, in the present embodiment, an outer shape of the region between the first heating element and the second heating element may have a first region side close to the second side and a second region side farther from the second side than is the first region side, and the temperature sensor may be arranged between the first region side and the center of the region between the first heating element and the second heating element.

For example, since the position where the temperature is the highest changes with the elapse of time from the center of the region to the second side, by arranging the temperature sensor between the center of the region and the first region side, it is possible to detect the overheated state at an early stage and prevent occurrence of a malfunction caused by overheating of the heating element.

In addition, in the present embodiment, the heating element is a transistor whose gate voltage is controlled by the control circuit.

In this way, even in a configuration in which the heating element is a transistor whose gate voltage is controlled by the control circuit, the heat dissipation of heat from the transistor can be improved. Further, it is also possible to prevent heat from accumulating in a narrow region between the transistor and a side of the integrated circuit device facing the transistor with a closest distance, and to avoid the occurrence of heat bias inside the integrated circuit device.

In addition, in the present embodiment, the transistor may include a plurality of unit transistors, and a longitudinal direction of a gate of each unit transistor is a direction along the short side.

In this way, even when the transistor includes a plurality of unit transistors whose gate voltage is controlled by the control circuit, the heat dissipation of the transistor can be improved. Further, it is also possible to prevent heat from being accumulated in a narrow region between the unit transistors and a side of the integrated circuit device facing the unit transistors with a closest distance, and to avoid the occurrence of heat bias inside the integrated circuit device.

In addition, in the present embodiment, the integrated circuit device further includes a temperature sensor configured to detect a temperature of the transistor, and when a direction along the first side of the integrated circuit device is set as an X direction and a direction along the second side is set as a Y direction, the transistor may include a first transistor, and a second transistor coupled in parallel with the first transistor and arranged adjacent to the first transistor along the Y direction with a region interposed therebetween. Further, the temperature sensor may be arranged at an arrangement position where a position in the X direction is a position between a center of the region and the second side, and a position in the Y direction is a position between the first transistor and the second transistor.

In this way, by dividing the transistor into the first transistor and the second transistor, an area in which the heating element is in contact with the outside can be increased, the heat dissipation of the heating element can be improved, and the temperature sensor can be arranged in the region between the first transistor and the second transistor.

In addition, in the present embodiment, an outer shape of the region between the first transistor and the second transistor may have a first region side close to the second side and a second region side farther from the second side than is the first region side, and the temperature sensor may be arranged between the center of the region and the first region side.

For example, the position where the temperature is the highest changes with the elapse of time from the center of the region to the second side in is the region between the first transistor and the second transistor after the start of heat generation. Therefore, by arranging the temperature sensor between the center of the region and the first region side, it is possible to detect the overheated state at an early stage and prevent occurrence of a malfunction caused by overheating.

Further, an integrated circuit device according to the present embodiment includes a charging transistor configured to charge a load, a discharging transistor configured to discharge the load, and a control circuit configured to control a current flowing through the charging transistor and a current flowing through the discharging transistor. In addition, an outer shape of the charging transistor has a first short side and a first long side, an outer shape of the discharging transistor has a second short side and a second long side, and an outer shape of the integrated circuit device has a first side, a second side intersecting the first side, and a third side which is an opposite side of the first side. A distance between the first long side of the charging transistor and the first side of the integrated circuit device is larger than a distance between the first short side of the charging transistor and the second side of the integrated circuit device. In addition, a distance between the second long side of the discharging transistor and the third side of the integrated circuit device is larger than a distance between the second short side of the discharging transistor and the second side of the integrated circuit device.

According to the present embodiment, by setting the outer shapes of the charging transistor and the discharging transistor into a shape having a long side and a short side, an area in which the charging transistor and the discharging transistor are in contact with the outside is increased, and the heat dissipation can be improved. Further, by arranging the positions of the charging transistor and the discharging transistor as in the present embodiment, it is also possible to prevent heat from being accumulated in a narrow region between the charging transistor or the discharging transistor and a facing side of the integrated circuit device closest to the charging transistor or the discharging transistor, and to avoid the occurrence of heat bias.

In addition, in the present embodiment, a length of the first long side of the charging transistor may be at least twice a length of the first short side, and a length of the second long side of the discharging transistor may be at least twice a length of the second short side.

In this way, as a ratio of a length of the long side to a length of the short side of the charging transistor and a ratio of a length of the long side to a length of the short side of the discharging transistor are increased, the area in which the charging transistor and the discharging transistor are in contact with the outside is increased, and the heat dissipation can be improved.

In addition, in the present embodiment, the integrated circuit device further includes a first temperature sensor configured to detect a temperature of the charging transistor and a second temperature sensor configured to detect a temperature of the discharging transistor. When a direction along the first side of the integrated circuit device is set as an X direction and a direction along the second side is set as a Y direction, the charging transistor may include a first charging transistor, and a second charging transistor arranged adjacent to the first charging transistor along the Y direction with a first region interposed therebetween. Further, the discharging transistor may include a first discharging transistor, and a second discharging transistor arranged adjacent to the first discharging transistor along the Y direction with a second region interposed therebetween. The first temperature sensor may be arranged at a first arrangement position where a position in the X direction is a position between a center of the first region and the second side, and a position in the Y direction is a position between the first charging transistor and the second charging transistor. Further, the second temperature sensor may be arranged at a second arrangement position where a position in the X direction is a position between a center of the second region and the second side, and a position in the Y direction is a position between the first discharging transistor and the second discharging transistor.

In this way, in the charging transistor, by arranging the first temperature sensor closer to the second side than is the center of the first region where the temperature is the highest, it is possible to reliably detect the overheated state and prevent occurrence of a malfunction caused by overheating of the charging transistor. Further, in the discharging transistor, by arranging the second temperature sensor closer to the second side than is the center of the second region where the temperature is the highest, it is possible to reliably detect the overheated state and prevent occurrence of a malfunction caused by overheating of the discharging transistor.

In addition, in the present embodiment, an outer shape of the first region between the first charging transistor and the second charging transistor may have a first region side close to the second side and a second region side farther from the second side than is the first region side, and an outer shape of the second region between the first discharging transistor and the second discharging transistor may have a third region side close to the second side and a fourth region side farther from the second side than is the third region side. The first temperature sensor may be arranged between the center of the first region and the first region side, and the second temperature sensor may be arranged between the center of the second region and the third region side.

For example, after the start of heat generation, the position where the temperature is the highest changes with the elapse of time from the center of the first region to the second side in the charging transistor, and changes with the elapse of time from the center of the second region to the second side in the discharging transistor. Therefore, by arranging the first temperature sensor between the center of the first region and the first region side in the charging transistor and arranging the second temperature sensor between the center of the second region and the third region side in the discharging transistor, it is possible to detect the overheated state at an early stage and prevent occurrence of a malfunction caused by overheating.

Although the present embodiment has been described in detail above, it will be easily understood by those skilled in the art that many modifications can be made without substantially departing from the novel matters and effects of the present disclosure. Therefore, all such modifications are within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. Further, the configurations and operations of the integrated circuit device, the heating element, the transistor, the charging transistor, the discharging transistor, the control circuit and the temperature sensor are not limited to those described in the present embodiment, and various modifications can be made.

What is claimed is:

1. An integrated circuit device, comprising:
   a charging transistor configured to charge a load;
   a discharging transistor configured to discharge the load;
   a first temperature sensor configured to detect a temperature of the charging transistor;
   a second temperature sensor configured to detect a temperature of the discharging transistor; and
   a control circuit configured to control a current flowing through the charging transistor and a current flowing through the discharging transistor, wherein an outer shape of the charging transistor has a first short side and a first long side, an outer shape of the discharging transistor has a second short side and a second long side, an outer shape of the integrated circuit device has a first side, a second side intersecting the first side, and a third side which is an opposite side of the first side, a distance between the first long side of the charging transistor and the first side of the integrated circuit device is larger than a distance between the first short side of the charging transistor and the second side of the integrated circuit device, a distance between the second long side of the discharging transistor and the third side of the integrated circuit device is larger than a distance between the second short side of the discharging transistor and the second side of the integrated circuit device, when a direction along the first side of the integrated circuit device is set as an X direction and a direction along the second side is set as a Y direction, the charging transistor includes a first charging transistor, and a second charging transistor arranged adjacent to the first charging transistor along the Y direction with a first region interposed therebetween, the discharging transistor includes a first discharging transistor, and a second discharging transistor arranged adjacent to the first discharging transistor along the Y direction with a second region interposed therebetween, the first temperature sensor is arranged at a first arrangement position where a position in the X direction is a position between a center of the first region and the second side, and a position in the Y direction is a position between the first charging transistor and the second charging transistor, and the second temperature sensor is arranged at a second arrangement position where a position in the X direction is a position between a center of the second region and the second side, and a position in the Y direction is a position between the first discharging transistor and the second discharging transistor.

2. The integrated circuit device according to claim 1, wherein a length of the first long side of the charging transistor is at least twice a length of the first short side, and a length of the second long side of the discharging transistor is at least twice a length of the second short side.

3. The integrated circuit device according to claim 1, wherein an outer shape of the first region between the first charging transistor and the second charging transistor has a first region side close to the second side and a second region side farther from the second side than is the first region side, an outer shape of the second region between the first discharging transistor and the second discharging transistor has a third region side close to the second side and a fourth region side farther from the second side than is the third region side, the first temperature sensor is arranged between the center of the first region and the first region side, and the second temperature sensor is arranged between the center of the second region and the third region side.

* * * * *